United States Patent
Lin et al.

(10) Patent No.: US 10,535,681 B2
(45) Date of Patent: Jan. 14, 2020

(54) TOUCH DISPLAY DEVICE WITH MESH UNITS AND ANTI-STATIC ELECTRICITY CONNECTING PARTS

(71) Applicant: InnoLux Corporation, Miao-Li County (TW)

(72) Inventors: Hsiao-Lang Lin, Miao-Li County (TW); Jui-Jen Yueh, Miao-Li County (TW)

(73) Assignee: InnoLux Corporation, Miao-Li (TW)

( * ) Notice: Subject to any disclaimer, the term of this patent is extended or adjusted under 35 U.S.C. 154(b) by 0 days.

(21) Appl. No.: 16/454,065

(22) Filed: Jun. 27, 2019

(65) Prior Publication Data
US 2019/0319051 A1    Oct. 17, 2019

Related U.S. Application Data

(63) Continuation of application No. 15/489,754, filed on Apr. 18, 2017, now Pat. No. 10,401,997.

(Continued)

(51) Int. Cl.
*G06F 3/045* (2006.01)
*H01L 27/12* (2006.01)
*H01L 29/786* (2006.01)
*H01L 29/423* (2006.01)
*G02F 1/1333* (2006.01)

(Continued)

(52) U.S. Cl.
CPC ........ *H01L 27/1225* (2013.01); *G02F 1/1368* (2013.01); *G02F 1/13338* (2013.01); *G02F 1/133345* (2013.01); *G02F 1/134309* (2013.01); *G06F 3/0412* (2013.01); *H01L 27/124* (2013.01); *H01L 27/1222* (2013.01); *H01L 27/1248* (2013.01); *H01L 27/1251* (2013.01); *H01L 27/1255* (2013.01); *H01L 27/323* (2013.01); *H01L 27/3276* (2013.01); *H01L 29/24* (2013.01); *H01L 29/42356* (2013.01); *H01L 29/7869* (2013.01); *H01L 29/78648* (2013.01); *H01L 29/78675* (2013.01); *H01L 29/78696* (2013.01); *G02F 2001/13685* (2013.01); *G02F 2001/133388* (2013.01); *H01L 27/3262* (2013.01); *H01L 29/4908* (2013.01); *H01L 29/78672* (2013.01)

(58) Field of Classification Search
CPC ............. G06F 3/0412; G02F 1/133345; G02F 1/13338; G02F 1/134309
USPC ........................................................ 345/174
See application file for complete search history.

(56) References Cited

U.S. PATENT DOCUMENTS

2013/0293508 A1    11/2013    Lin
2015/0109246 A1    4/2015    Lee
(Continued)

*Primary Examiner* — Jonathan M Blancha
(74) *Attorney, Agent, or Firm* — Winston Hsu

(57) ABSTRACT

A touch display device includes a substrate, light emitting units, and a touch layer. The touch layer includes mesh units disposed corresponding to the light emitting units, wherein each of the mesh units has a mesh opening, and the light emitting units are disposed in the mesh openings. The mesh units include a first mesh unit and a second mesh unit. The light emitting units include a first light emitting unit and a second light emitting unit having different color from the first light emitting unit. The first light emitting unit is disposed in the first mesh unit. The second light emitting unit is disposed in the second mesh unit. An area of the first mesh unit is greater than an area of the second mesh unit, and an area of the first light emitting unit is greater than an area of the second light emitting unit.

20 Claims, 14 Drawing Sheets

Related U.S. Application Data

(60) Provisional application No. 62/429,162, filed on Dec. 2, 2016.

(51) Int. Cl.
| | | |
|---|---|---|
| *G02F 1/1343* | (2006.01) | |
| *G02F 1/1368* | (2006.01) | |
| *H01L 29/24* | (2006.01) | |
| *H01L 27/32* | (2006.01) | |
| *G06F 3/041* | (2006.01) | |
| *H01L 29/49* | (2006.01) | |

(56) References Cited

U.S. PATENT DOCUMENTS

| | | |
|---|---|---|
| 2015/0346866 A1 | 12/2015 | Kusunoki |
| 2016/0197610 A1 | 7/2016 | Lee |
| 2016/0202804 A1 | 7/2016 | Park |
| 2016/0202833 A1 | 7/2016 | Kim |
| 2016/0266691 A1 | 9/2016 | Jang |
| 2016/0291780 A1 | 10/2016 | Namkung |
| 2016/0306487 A1 | 10/2016 | Jeong |
| 2016/0334910 A1 | 11/2016 | Ono |
| 2018/0120971 A1 | 5/2018 | Lee |

(A)

(B)

TOUCH DISPLAY DEVICE WITH MESH UNITS AND ANTI-STATIC ELECTRICITY CONNECTING PARTS

CROSS REFERENCE TO RELATED APPLICATIONS

This application is a continuation of U.S. application Ser. No. 15/489,754, filed on Apr. 18, 2017, which claims the benefit of U.S. Provisional Patent Application No. 62/429,162, filed on Dec. 2, 2016, the entire contents of which are incorporated herein by reference.

BACKGROUND OF THE DISCLOSURE

1. Field of the Disclosure

The present disclosure relates to a touch display device, and more particularly, to a touch display device including mesh units.

2. Description of the Prior Art

In recent years, touch sensing technologies have developed rapidly. There are many consumer electronics integrated with touch sensing functions, such as mobile phones, GPS navigator systems, tablet PCs, and laptop PCs. Those consumer electronics are mainly characterized by integrating original display functions with touch sensing functions, so as to perform as a touching display device. In conventional resistance touch technology or capacitive touch technology, the sensing electrode for detecting touching signals are usually made of indium tin oxide (ITO), in order to avoid the interference to display functions. However, due to the high electrical resistivity of the indium tin oxide in comparison with metal, the sensing electrode made of indium tin oxide may lead to higher integrated resistance and be poor in reaction rate. Therefore, a metal mesh consisted of interweaved metal wires are developed in related arts to replace indium tin oxide for increasing the reaction rate. However, the static electric damage tends to occur at the connection points where the edge of the metal mesh connects to the connecting wire or the connecting pad, and the performance of touch sensing may be influenced. In addition, the displayed light will be partially blocked by the metal mesh, and the display effect will be influenced by the metal mesh in the touch display device.

SUMMARY OF THE DISCLOSURE

It is one of the objectives of the present disclosure to provide a touch display device that includes anti-static electricity connecting part disposed between the connecting wire and the mesh units for preventing the static electric damage.

The present disclosure provides a touch display device that includes a substrate, a plurality of light emitting units, an insulating layer and a touch layer. The substrate has a display region and a peripheral region out of the display region. The light emitting units are disposed in the display region. The insulating layer is disposed on the plurality of light emitting units. The touch layer is disposed on the insulating layer and includes a plurality of mesh units, a first connecting wire and a first anti-static electricity connecting part. The plurality of mesh units are disposed corresponding to the plurality of light emitting units, wherein each of the mesh units has a mesh opening, and the plurality of light emitting units are disposed in the mesh openings. The first connecting wire is disposed in the peripheral region, and the first anti-static electricity connecting part is disposed between a first portion of the plurality of mesh units and the first connecting wire. The first connecting wire is electrically connected to the first portion of the mesh units through the first anti-static electricity connecting part.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

Figure 1:
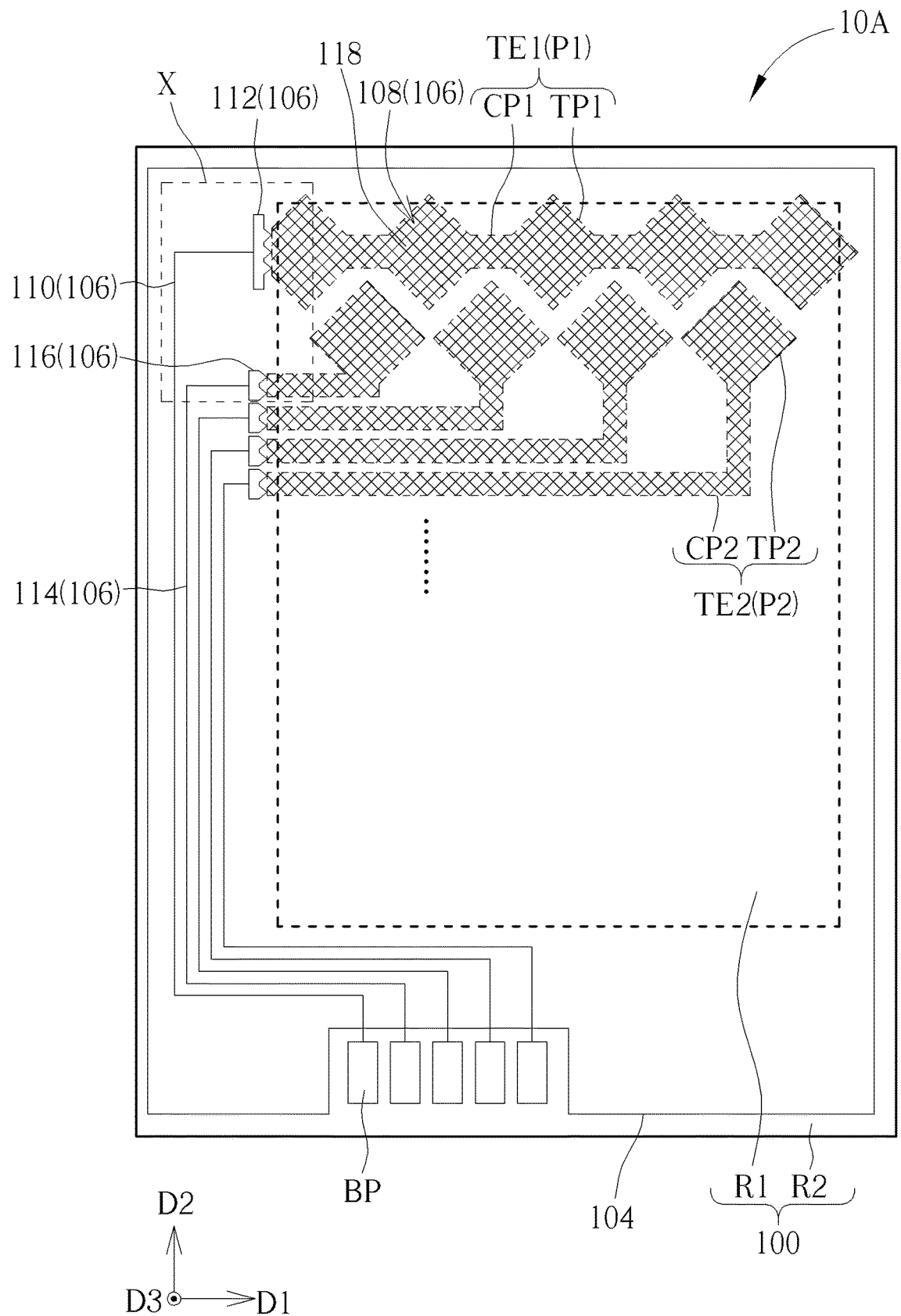
FIG. 1 is a schematic diagram illustrating a top view of a touch display device according to a first embodiment of the present disclosure.
Figure 2:
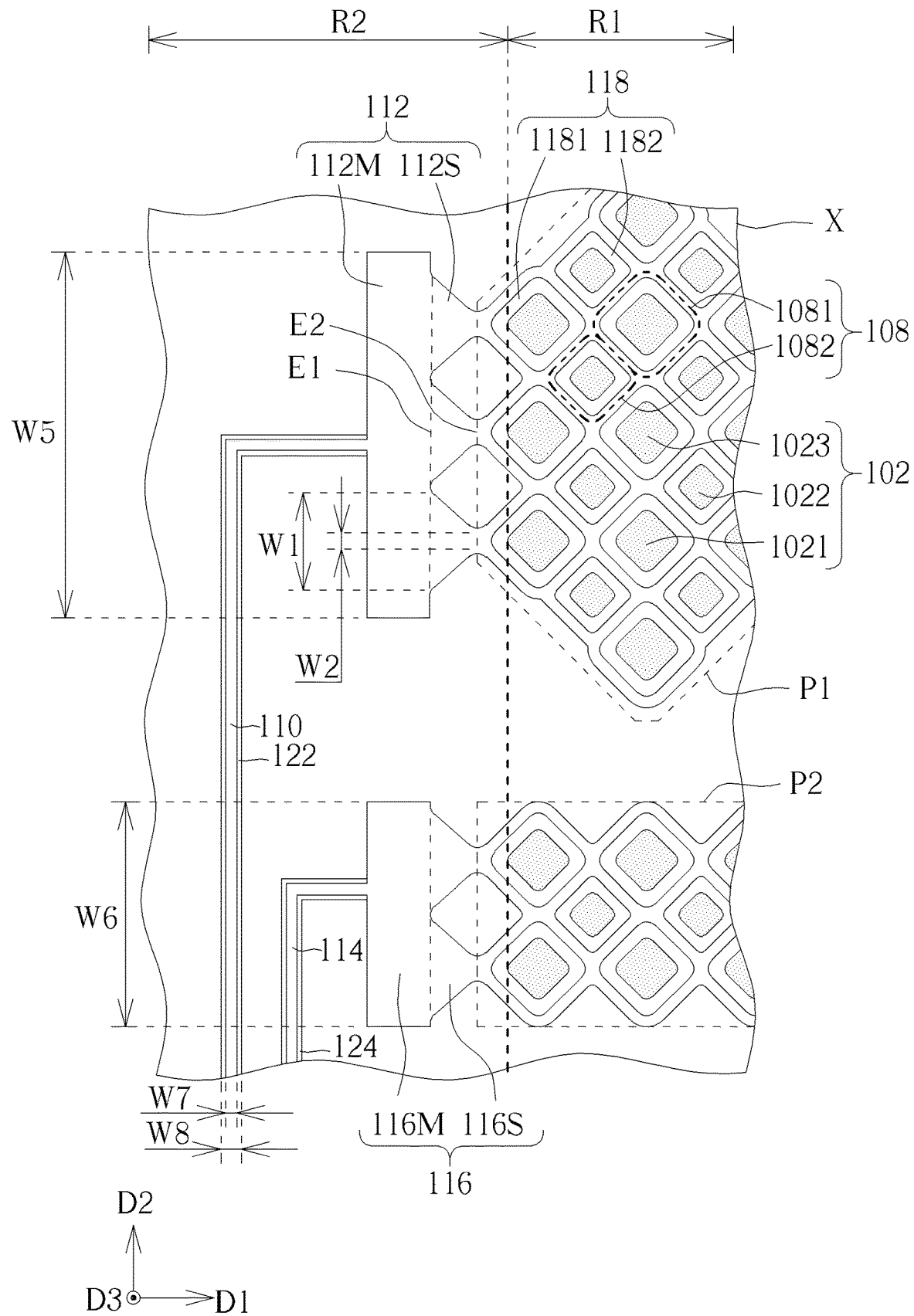
FIG. 2 is a schematic diagram of partial enlargement of a portion of the touch display device shown in FIG. 1.

Referring to FIG. 1 and FIG. 2, FIG. 1 is a schematic diagram illustrating a top view of a touch display device according to a first embodiment of the present disclosure, and FIG. 2 is a schematic diagram of partial enlargement of a portion of the touch display device shown in FIG. 1, wherein FIG. 2 shows the partial enlargement of the portion X in FIG. 1. According to the first embodiment of the present disclosure, a touch display device 10A is disclosed, wherein the touch display device 10A may be an on-cell touch display device, an in-cell touch display device, or an out-cell touch display device for example, but not limited thereto. The touch display device 10A includes a substrate 100, a plurality of light emitting units 102, an insulating layer 104 and a touch layer 106. For clarity, the figures omit some devices in the touch display device 10A other than the devices mentioned above, but the present disclosure is not limited to FIG. 1 and FIG. 2. The substrate 100 has a display region R1 and a peripheral region R2 out of the display region R1. In this embodiment, the peripheral region R2 surrounds the display region R1, but not limited thereto. The substrate 100 may include a glass substrate, a plastic substrate, a ceramic substrate, or other suitable rigid or flexible substrates. For example, the substrate 100 of this embodiment is used for supporting the light emitting units 102 and the touch layer 106 formed thereon. The substrate 100 may be, but not limited to, a transparent substrate or an opaque substrate. When the light emitting units 102 are self-emissive, the substrate 100 may be the opaque substrate.

The light emitting units 102 (shown in FIG. 2) are disposed in the display region R1, and may include organic light emitting units, light emitting diode (LED) units (such as LED with micro size called micro LED), quantum LED (QLED) units, or other suitable types of light emitting structures. Moreover, the light emitting units 102 may also represent apertures of pixels of a liquid crystal display panel. The light emitting units 102 may include different light emitting units configured to emit light beams of different colors (different spectrums). For example, the light emitting units 102 may include a light emitting unit 1021 configured to emit red light (main peak of wave length of spectrum is ranging from 630 nm to 780 nm), a light emitting unit 1022 configured to emit green light (main peak of wave length of spectrum is ranging from 530 nm to 560 nm), and a light emitting unit 1023 configured to emit blue light (main peak of wave length of spectrum is ranging from 450 nm to 495 nm), but not limited thereto. In this embodiment, at least two of the light emitting units 102 have different areas. For example, the area of the light emitting unit 1022 may be smaller than the area of the light emitting unit 1021 and the area of the light emitting unit 1023 for specific color mixing considerations, but not limited thereto. In some embodiments, all of the light emitting units 102 have the same areas.

In this embodiment, the insulating layer 104 at least covers the display region R1, and further extends to cover a portion of the peripheral region R2. The insulating layer 104 is disposed on the emitting units 102 and may include inorganic oxide, inorganic nitride, organic material or other suitable insulation materials. In addition, the insulating layer 104 may directly contact the light emitting units 102, or other layers may be formed between the insulating layer 104 and the light emitting units 102.

The touch layer 106 is disposed on the insulating layer 104. The touch layer 106 of this embodiment may be a patterned metal layer, and the material of the patterned metal layer may include aluminum (Al), copper (Cu), molybdenum (Mo), titanium (Ti), a composition layer of the material mentioned above, or an alloy of the material mentioned above, but not limited thereto. In some embodiments, the mesh units 108 may also be made of other suitable conductive materials, such as oxide conductive materials. The touch layer 106 includes a plurality of mesh units 108, a first connecting wire 110 and a first anti-static electricity connecting part 112. In this embodiments, a first portion P1 of the mesh units 108 forms at least one first touch electrode TE1. Each first touch electrode TE1 includes a plurality of first touch pads TP1 and a plurality of first connection lines CP1. In the same first touch electrode TE1, the first touch pads TP1 are sequentially arranged along a first direction D1, and each of the first connection lines CP1 is disposed between two adjacent first touch pads TP1, so as to electrically connect the first touch pads TP1 to form the first touch electrode TE1. The first touch electrode TE1, composed of the first portion P1 of the mesh units 108, is electrically connected to the first connecting wire 110 through the first anti-static electricity connecting part 112, and the first connecting wire 110 is further electrically connected to a bonding pad BP in the peripheral region R2.

In addition, the touch layer 106 may further include a plurality of second connecting wires 114 and a plurality of second anti-static electricity connecting parts 116 electrically connected to a second portion P2 of the mesh units 108. The second portion P2 of the mesh units 108 are electrically isolated from the first portion P1 of the mesh units 108 and forms at least one second touch electrode TE2. In this embodiment, the second portion P2 of the mesh units 108 forms a plurality of second touch electrodes TE2. Each of the second touch electrodes TE2 includes a second touch pad TP2 and a second connection line CP2, and the second touch pads TP2 are electrically connected to the second anti-static electricity connecting parts 116 through the second connection lines TP2 respectively. Therefore, each second touch electrode TE2, composed of the second portion P2 of the mesh units 108, is electrically connected to the corresponding second connecting wire 114 through the corresponding second anti-static electricity connecting part 116, and further electrically connected to a bonding pad BP through the second connecting wire 114. The second touch pads TP2 of the second touch electrodes TE2 are sequentially arranged along the first direction D1, each of which may be disposed between two adjacent first touch pads TP1. The first touch electrode TE1 and the second touch electrodes TE2 may be repeatedly and alternately formed on the substrate 100 in a second direction D2, wherein the second direction D2 is substantially perpendicular to the first direction D1. The touch display device 10A in this embodiment is a mutual-capacitance touch display device as an example. Accordingly, the first touch electrodes TE1 may serve as touch driving electrode (Tx) of the touch display device 10A, and the second touch electrodes TE2 of this embodiment may serve as touch sensing electrodes (Rx), but not limited thereto. In addition, although the shape of the first touch pad TP1 and the second touch pad TP2 is diamond or diamond-like as an example in this embodiment, the touch pads may have any suitable shape based on pad design and the type of touch panel according to the present disclosure.

As shown in FIG. 2, each of the mesh units 108 is composed of a plurality of mesh lines that are connected to each other to form a frame pattern or a loop pattern, and therefore each of the mesh units 108 has a mesh opening 118 enclosed by the frame pattern or the loop pattern formed by the mesh lines. Any two adjacent mesh units 108 may share a common mesh line to form the mesh structures. In other words, it could be seen that each mesh unit 108 overlaps a portion of another adjacent mesh unit 108. The mesh units 108 are disposed corresponding to the light emitting units 102, which means each of the light emitting units 102 is disposed in one of the mesh openings 118 in top view and exposed by the mesh lines. In this embodiment, at least two of the mesh openings 118 may have different areas. For example, the mesh units 108 may include a plurality of mesh units 1081 and a plurality of mesh units 1082, wherein each of the mesh units 1081 has a mesh opening 1181, each of the mesh units 1082 has a mesh opening 1182, and the areas of the mesh units 1081 or the mesh openings 1181 is greater than the areas of the mesh units 1082 or the mesh openings 1182. The light emitting unit 1021 and the light emitting unit 1023 are disposed in the mesh openings 1181 respectively, and the light emitting unit 1022 is disposed in the mesh opening 1182 in a third direction D3 that is perpendicular to the surface of the substrate 100. In other words, when the area of the light emitting unit 1022 is smaller than the area of the light emitting unit 1021 and the area of the light emitting unit 1023, the mesh opening 1182 corresponding to the light emitting unit 1022 may be smaller than the mesh opening 1181 corresponding to the light emitting units 1021 and 1023, but not limited thereto. In some embodiments, the areas of the mesh openings 118 may be equal to one another for other design considerations.

In this embodiment, the touch layer 106 including the mesh units 108 are formed through a photolithography process, thus the mesh units 108 can be more accurately positioned so as to form the mesh openings 118 right above the corresponding light emitting units 102 precisely, and no light emitting units 102 is covered or shielded by the mesh lines in the third direction D3. However, the process of forming the mesh units 108 is not limited. With the configuration of disposing the light emitting units 102 in the mesh openings 118 of the mesh units 108 in this embodiment, the light emitted from the light emitting units 102 will not be blocked by the mesh units 108 (the mesh lines) in the third direction D3. Accordingly, the light emitting intensity of the touch display device 10A is enhanced in comparison with conventional touch display device, and the display quality of the touch display device 10A may be improved.

Figure 4:
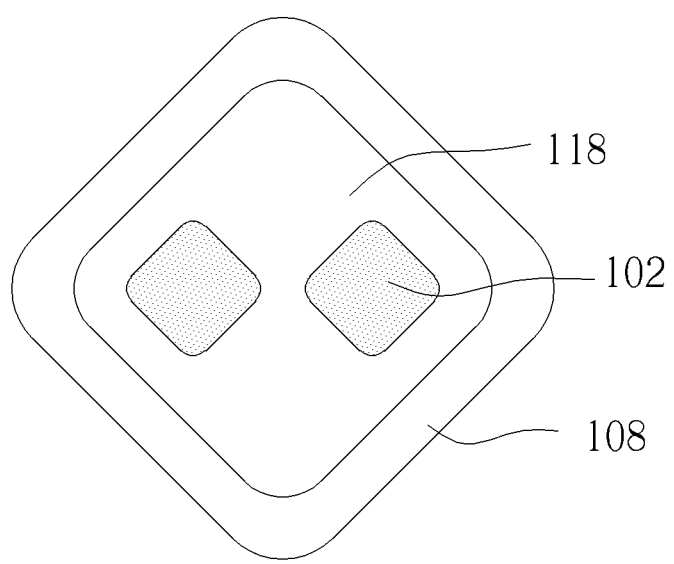
FIG. 4 is a schematic diagram illustrating top views of a mesh unit and corresponding light emitting units according to a first variant embodiment and a second variant embodiment of the first embodiment of the present disclosure.
Figure 4:
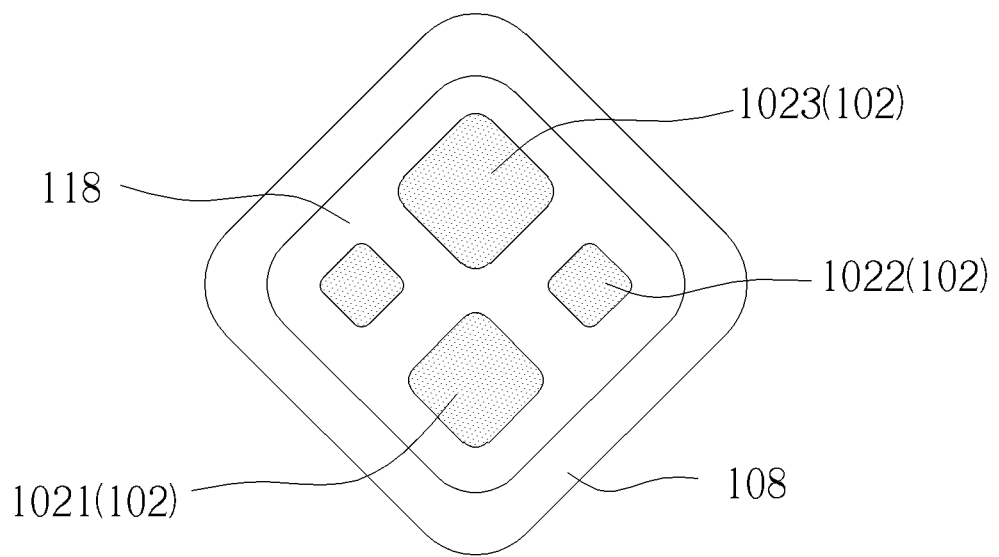

It should be noted that the present disclosure is not limited to the configuration of disposing only one light emitting unit 102 in the corresponding mesh opening 118 of one mesh unit 108. Some variant configurations of the light emitting unit 102 with the mesh opening 118 are introduced in FIG. 4 as an example, wherein FIG. 4 is a schematic diagram illustrating top views of a mesh unit and corresponding light emitting units according to a first variant embodiment and a second variant embodiment of the first embodiment of the present disclosure. According to the top view of the touch display device of the first variant embodiment shown in the part (A) in FIG. 4, there are two light emitting units 102 disposed in the mesh opening 118 of one mesh unit 108, wherein the light emitting units 102 may be any combination selected from the light emitting unit 1021, the light emitting unit 1022, and the light emitting unit 1023 mentioned above, and the number of the light emitting units 102 may also be three or more. According to the second variant embodiment shown in the part (B) in FIG. 4, there are four light emitting units 102 disposed in the mesh opening 118 of one mesh unit 108. For example, the light emitting units 102 in this variant embodiment may include one light emitting unit 1021, one light emitting unit 1023, and two light emitting units 1022. However, the combination of the light emitting unit 1021, the light emitting unit 1023, and the light emitting unit 1022 in the present disclosure is not limited to FIG. 4.

Referring to FIG. 1 and FIG. 2, the first connecting wire 110 and the first anti-static electricity connecting part 112 are disposed in the peripheral region R2, wherein the first anti-static electricity connecting part 112 is disposed between the first portion P1 of the mesh units 108 and the first connecting wire 110. Specifically, the first anti-static electricity connecting part 112 includes a first main portion 112M and three first sub portions 112S for example. The first main portion 112M is disposed between the first connecting wire 110 and the first sub portions 112S, the first sub portions 112S are disposed between the first main portion 112M and the first portion P1 of the mesh units 108, and the first sub portions 112S are extended toward the display region R1 and the first portion P1 of the mesh units 108 along the first direction D1 from the first main portion 112M. Each of the first sub portions 112S directly connects to one of the mesh units 108 that is located at the edge of the display region R1 in this embodiment, but the present disclosure is not limited thereto.

Each first sub portion 112S has a first edge E1 and a second edge E2 (shown in FIG. 2), wherein the first edge E1 is adjacent to the first main portion 112M, and the second edge E2 is adjacent to the display region R1. The first edge E1 has a first width W1 in the second direction D2, the second edge E2 has a second width W2 in the second direction D2, and the first width W1 is greater than the second width W2. In addition, the widths of the first sub portion 112S between the first edge E1 and the second edge E2 in the second direction D2 are gradually reduced from the first width W1 to the second width W2, and therefore the shape of the first sub portion 112S may substantially be a trapezoid, but not limited thereto. In this embodiment, the shape and dimensions of all the first sub portions 112S are the same, but not limited thereto.

Similarly, the second anti-static electricity connecting part 116 includes a second main portion 116M and a plurality of sub portions 116S, wherein two sub portions 116S is shown in FIG. 2 as an example. The second main portion 116M is disposed between the second connecting wire 114 and the second portion P2 of the mesh units 108. The sub portions 116S are disposed between the second main portion 116M and the second portion P2 of the mesh units 108, and the sub portions 116S are extended toward the display region R1 along the first direction D1. Each of the sub portions 116S directly connects to one of the mesh units 108 of the second portion P2, which is located at the edge of the display region R1 in this embodiment. In this embodiment, the shape and dimensions of the sub portions 116S are the same, and can also be the same as that of the first sub portions 112S, but not limited thereto. The shape and dimensions of the sub portions 116S of the second anti-static electricity connecting part 116 may not be identical in other embodiments.

In this embodiment, a maximum width of the first main portion 112M in the second direction D2 is defined as a fifth width W5, a maximum width of the second main portion 116M in the second direction D2 is defined as a sixth width W6, and the fifth width W5 is different from the sixth width W6. For example, the fifth width W5 is greater than the sixth width W6, but not limited thereto. In some embodiments, the first main portion 112M and the second main portion 116M may have the same maximum widths.

In the conventional touch display device including mesh structure as the touch electrodes, the width of the conductive layer, such as a metal layer, is suddenly narrowed from the connecting part to the mesh unit side. Therefore, the contact point where the mesh unit connects to the connecting part is easily damaged by a relatively high static electricity when a large current is transmitted between the mesh unit and the connecting part. However, the anti-static electricity connecting part of the present disclosure includes the sub portions that have gradually reduced widths from the main portions of the anti-static electricity connecting part to the mesh units, and therefore the sub portions can be used as buffer zones for preventing the static electricity damage issue when the relatively large current is transmitted between the main portions and the mesh units.

Figure 3:
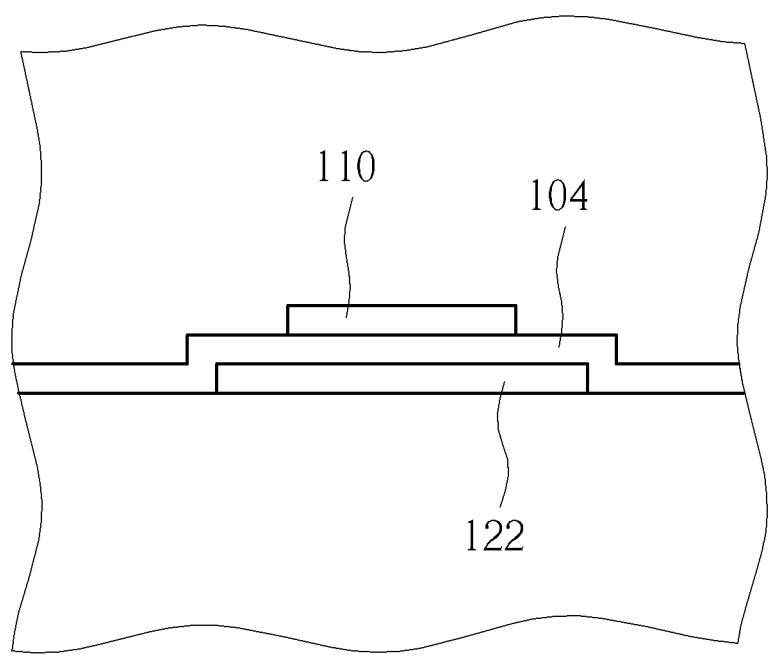
FIG. 3 is a cross-sectional diagram of a first connecting wire and a first shielding pattern shown in FIG. 2.

Please refer to FIG. 3 together with FIG. 2, wherein FIG. 3 is a cross-sectional diagram of a first connecting wire and a first shielding pattern shown in FIG. 2. The touch display device 10A of this embodiment may optionally include a first shielding pattern 122 and a second shielding pattern 124 disposed between the substrate 100 and the touch layer 106. In this embodiment, the first shielding pattern 122 and the second shielding pattern 124 are disposed below the first connecting wire 110 and the second connecting wire 114 respectively. In other words, at least a portion of the first connecting wire 110 is overlapped with the first shielding pattern 122 in the third direction D3, and at least a portion of the second connecting wire 114 is overlapped with the second shielding pattern 124 in the third direction D3. The first shielding pattern 122 and the second shielding pattern 124 are electrically isolated from the first connecting wire 110 and the second connecting wire 114. For example, an insulating layer (such as the insulating layer 104) can be interposed between the first shielding pattern 122 and the first connecting wire 110, and also between the second shielding pattern 124 and the second connecting wire 114. The shielding patterns may be formed with the conductive material, so as to effectively reduce the influence of the signals (such as display signals) transmitted in the wires or traces underneath the touch layer 106. In some embodiments, the first shielding pattern 122 and the second shielding pattern 124 can further extend to be overlapped with the first anti-static electricity connecting part 112 and the second anti-static electricity connecting part 116 respectively.

In addition, a maximum width of the first connecting wire 110 in the first direction D1 is defined as a seventh width (denoted by "$7^{th}$ width" in the following relation) W7, a maximum width of the first shielding pattern 122 in the first direction D1 is defined as an eighth width (denoted by "$8^{th}$ width" in the following relation), and the seventh width W7 and the eighth width W8 have the relation: $7^{th}$ width$\leq 8^{th}$ width$\leq 2*(7^{th}$ width$)$. Similarly, the second connecting wire 114 and the second shielding pattern 124 also satisfy the above relation.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 5:
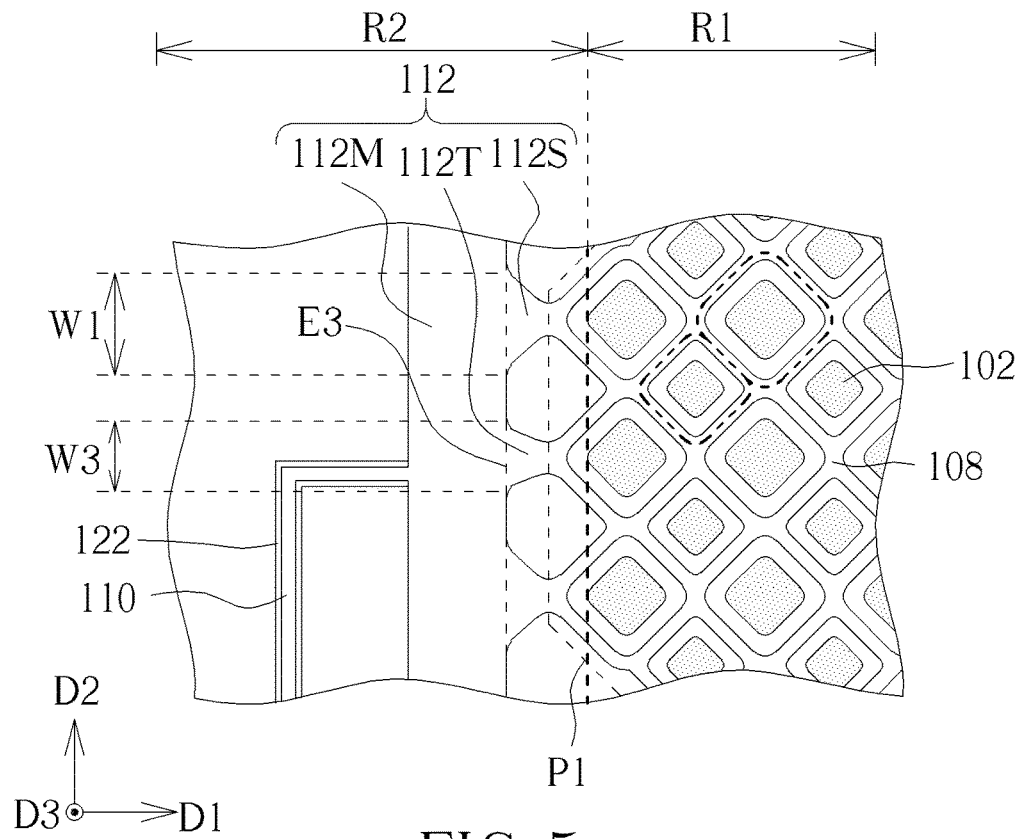
FIG. 5 is a schematic diagram of partial enlargement of a portion of a touch display device according to a second embodiment of the present disclosure.

Referring to FIG. 5, FIG. 5 is a schematic diagram of partial enlargement of a portion of a touch display device according to a second embodiment of the present disclosure. FIG. 5 shows the portion of the touch display panel that includes the first portion P1 of the mesh units 108 and the light emitting units 102 corresponding thereto, the first anti-static electricity connecting part 112, the first connecting wire 110, and the first shielding pattern 122. As shown in FIG. 5, the difference between this embodiment and the first embodiment is that the first anti-static electricity connecting part 112 of this embodiment further includes a second sub portion 112T. The second sub portion 112T is disposed between the first main portion 112M and the first portion P1 of the mesh units 108 in the first direction D1, and is disposed between two first sub portions 112S in the second direction D2, but not limited thereto. The second sub portion 112T has a third edge E3 adjacent to the first main portion 112M, the third edge E3 has a third width W3 in the second direction D2, and the third width W3 is different from the first width W1. In this embodiment, the third width W3 is less than the first width W1, but not limited thereto. The third width W3 may also be greater than the first width W1 in other embodiments.

Figure 6:
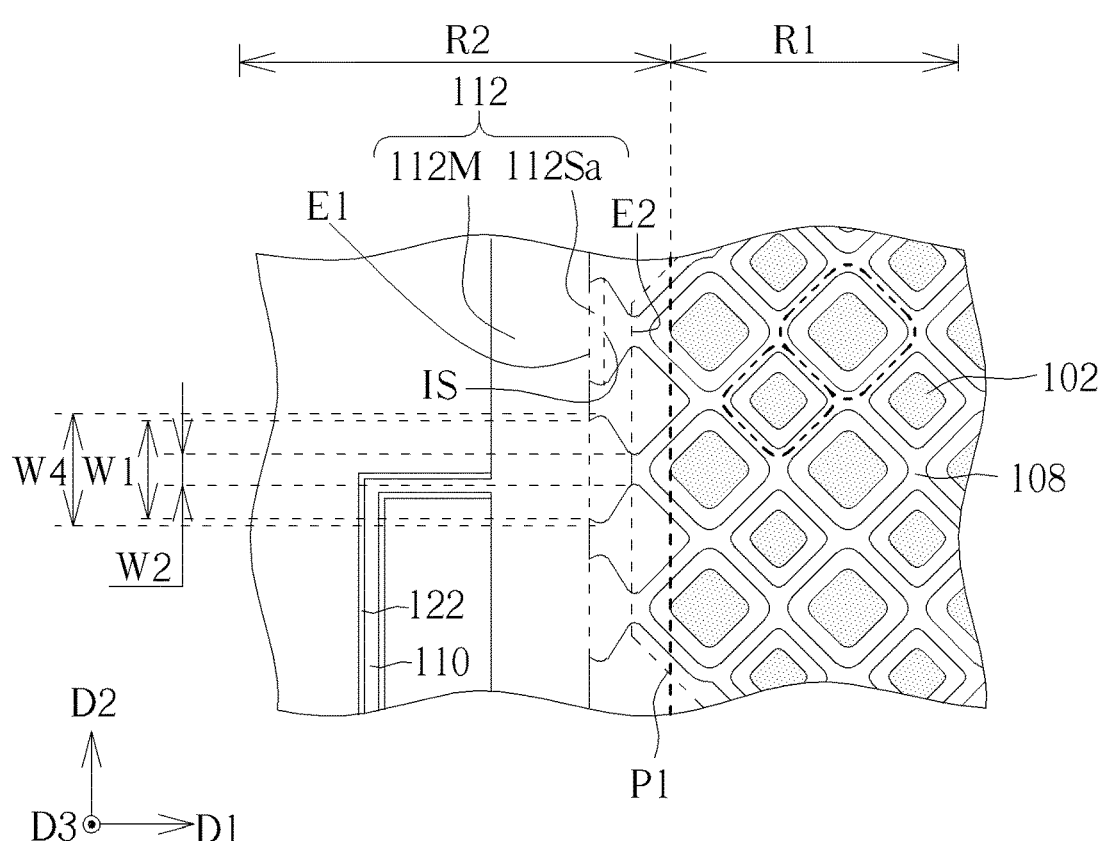
FIG. 6 is a schematic diagram of partial enlargement of a portion of a touch display device according to a third embodiment of the present disclosure.

Referring to FIG. 6, FIG. 6 is a schematic diagram of partial enlargement of a portion of a touch display device according to a third embodiment of the present disclosure. FIG. 6 shows the similar part of the touch display panel as FIG. 5, which includes the first portion P1 of the mesh units 108 and the light emitting units 102 corresponding thereto, the first anti-static electricity connecting part 112, the first connecting wire 110, and the first shielding pattern 122. As shown in FIG. 6, each first sub portion 112Sa of this embodiment has an intermediate section IS positioned between the first edge E1 and the second edge E2, and the intermediate section IS has a fourth width W4 in the second direction D2. The difference between this embodiment and the first embodiment is that the fourth width W4 is greater than the first width W1. For example, the width of the first sub portion 112Sa in the second direction D2 is gradually increased from the first edge E1 to the intermediate section IS along and further gradually reduced from the intermediate section IS to the second edge E2 along the first direction D1. In this embodiment, the shape of the first sub portion 112Sa is similar to a spade for example.

Figure 7:
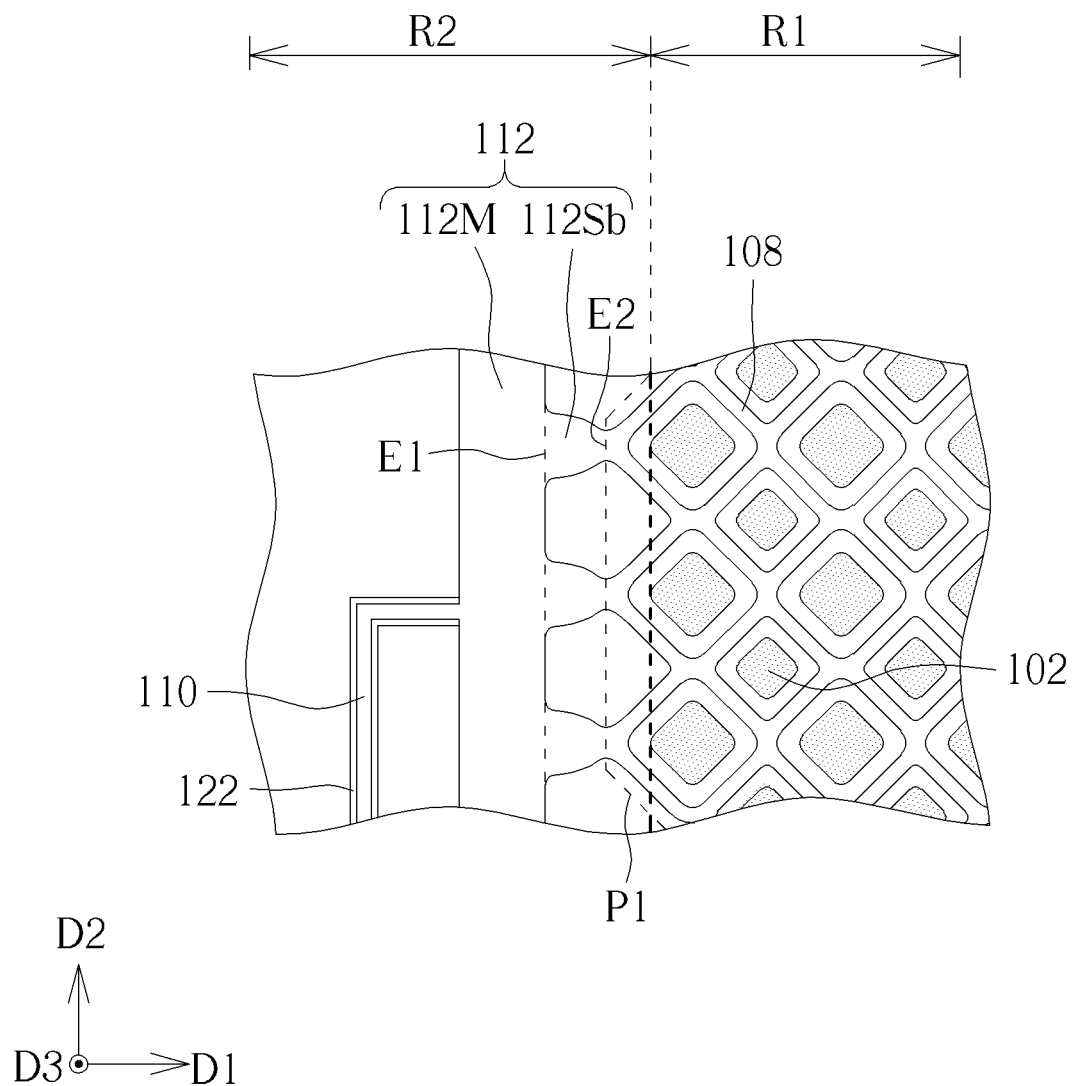
FIG. 7 is a schematic diagram of partial enlargement of a portion of a touch display device according to a fourth embodiment of the present disclosure.

Referring to FIG. 7, FIG. 7 is a schematic diagram of partial enlargement of a portion of a touch display device according to a fourth embodiment of the present disclosure. FIG. 7 shows the similar part of the touch display panel as FIG. 5. As shown in FIG. 7, the difference between this embodiment and the first embodiment is that the shape of each first sub portion 112Sb includes half of an ellipse (curved shape), and the shape may be similar to a bullet for example. In the first sub portion 112Sb of this embodiment, the width of the first sub portion 112Sb in the second direction D2 is gradually reduced from the first edge E1 to the second edge E2.

The above embodiments disclose different shapes and designs of the anti-static electricity connecting parts, the mesh units and the corresponding arrangement of the light emitting units, and these features can be arranged in collocation with each other in various embodiments. Also, these features of the anti-static electricity connecting parts included in the first embodiment to the fourth embodiment are all applicable to the following embodiments. In other words, the touch layer in each of the touch display devices disclosed in the following embodiments includes the mesh units, the first anti-static electricity connecting parts and the optional second anti-static electricity connecting parts, and each light emitting unit is corresponding to one of the mesh units, which means each light emitting unit is disposed in the corresponding mesh opening in the following embodiments.

Figure 8:
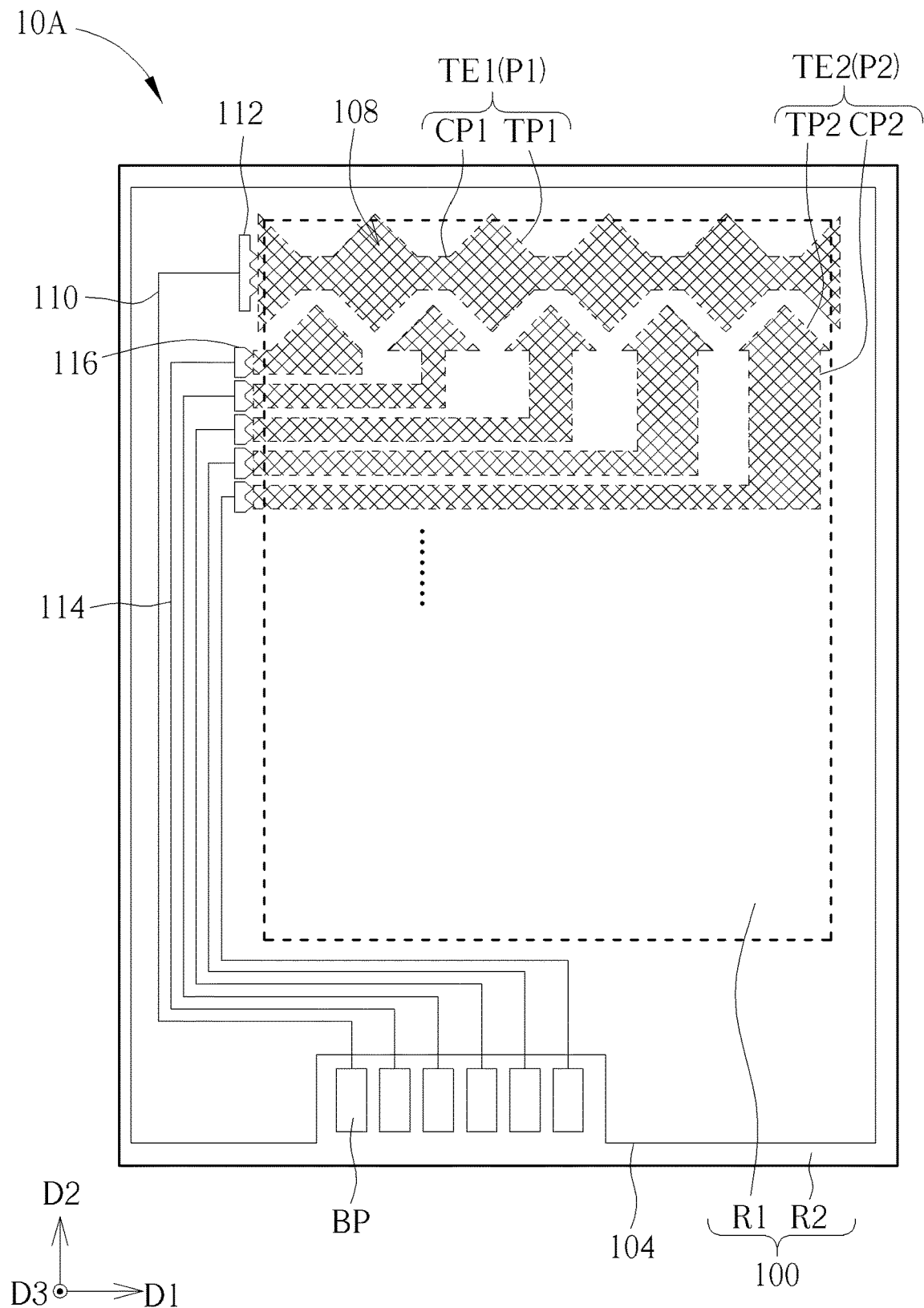
FIG. 8 is a schematic diagram of a touch display device according to a fifth embodiment of the present disclosure.

Referring to FIG. 8, FIG. 8 is a schematic diagram of a touch display device according to a fifth embodiment of the present disclosure. As shown in FIG. 8, the main difference between this embodiment and the first embodiment is that the shape of the second touch pads TP2 is triangle. Other features of the touch display device of this embodiment may be the same as or similar to the first embodiment, and therefore those features are not redundantly described herein.

Figure 9:
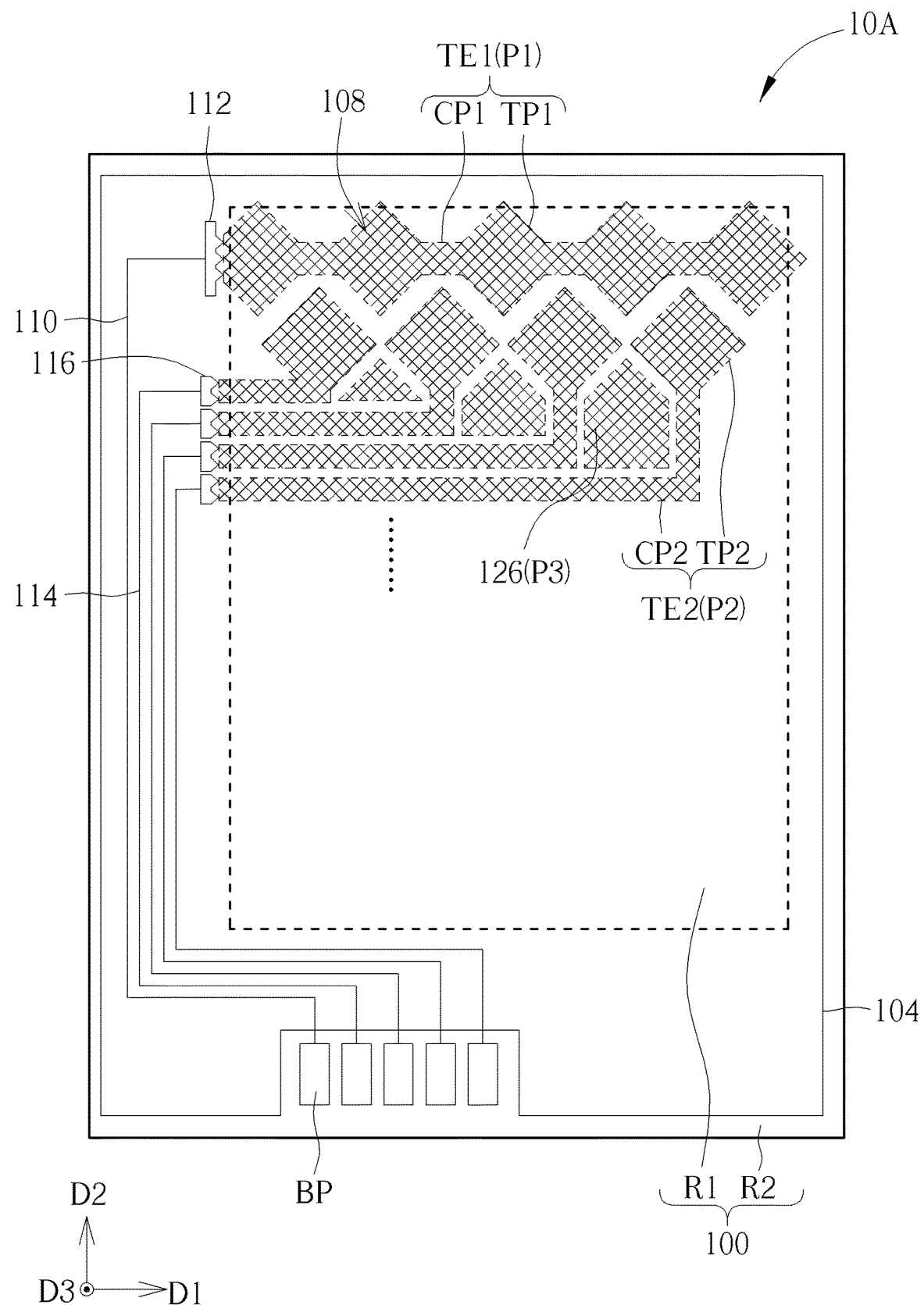
FIG. 9 is a schematic diagram of a touch display device according to a sixth embodiment of the present disclosure.

Referring to FIG. 9, FIG. 9 is a schematic diagram of a touch display device according to a sixth embodiment of the present disclosure. As shown in FIG. 9, the difference between this embodiment and the first embodiment is that a third portion P3 of the mesh units 108 forms a plurality of dummy mesh patterns 126 disposed between the first portion P1 of the mesh units 108 and the second portion P2 of the mesh units 108. Specifically, each of the dummy mesh patterns 126 is disposed in a space surrounded by one first touch pad TP1, two adjacent second touch pads TP2, and two adjacent second connection lines CP2, and the shapes of the dummy mesh patterns 126 may be determined according to the shape of the space and may be various. For example, the shapes of the dummy mesh patterns 126 may include triangle or pentagon, but not limited thereto. The dummy mesh patterns 126 are electrically isolated from the first touch electrodes TE1 and the second touch electrodes TE2, and the dummy mesh patterns 126 are floated in this embodiment. In other embodiment, the dummy mesh patterns 126 may be connected to ground (common) signal source.

Figure 10:
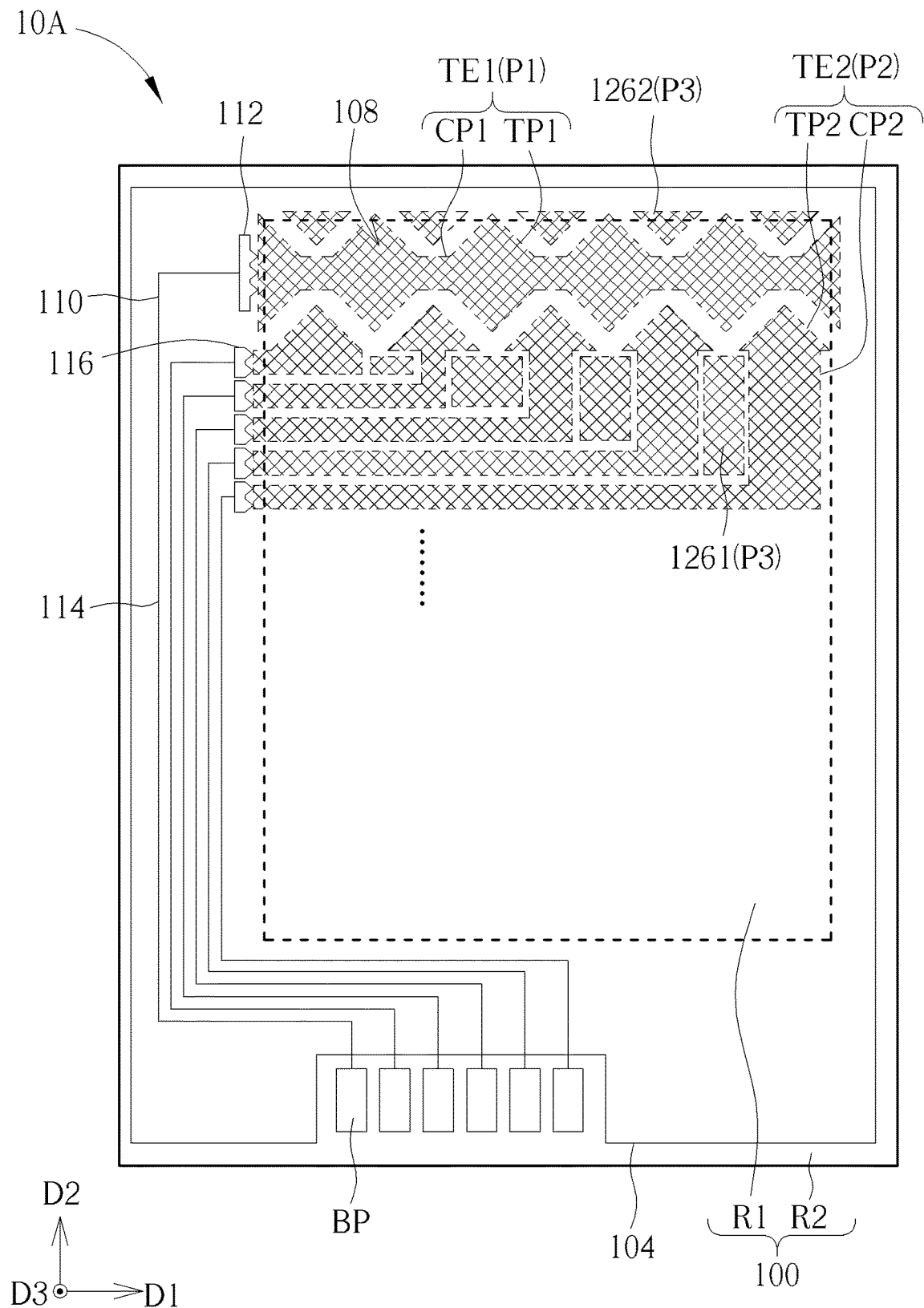
FIG. 10 is a schematic diagram of a touch display device according to a seventh embodiment of the present disclosure.

Referring to FIG. 10, FIG. 10 is a schematic diagram of a touch display device according to a seventh embodiment of the present disclosure. As shown in FIG. 10, the main difference between this embodiment and the sixth embodiment in FIG. 9 is that the shape of the second touch pads TP2 is triangle, as mentioned in the fifth embodiment in FIG. 8. In addition, the dummy mesh patterns in this embodiment include a plurality of dummy mesh patterns 1261 and a plurality of dummy mesh patterns 1262. Each dummy mesh patterns 1261 is disposed in a space surrounded by one first touch pad TP1, two adjacent second touch pads TP2, and two adjacent second connection lines CP2, and the shape of the dummy mesh pattern 1261 may be square, rectangle, or triangle. In another aspect, the dummy mesh patterns 1262 are disposed between one of the edges of the display region R1 and the first touch electrode TE1 adjacent to the edge. Each of the dummy mesh patterns 1262 is disposed between two adjacent first touch pads TP1, and the shape of the dummy mesh patterns 1262 may be triangle.

Figure 11:
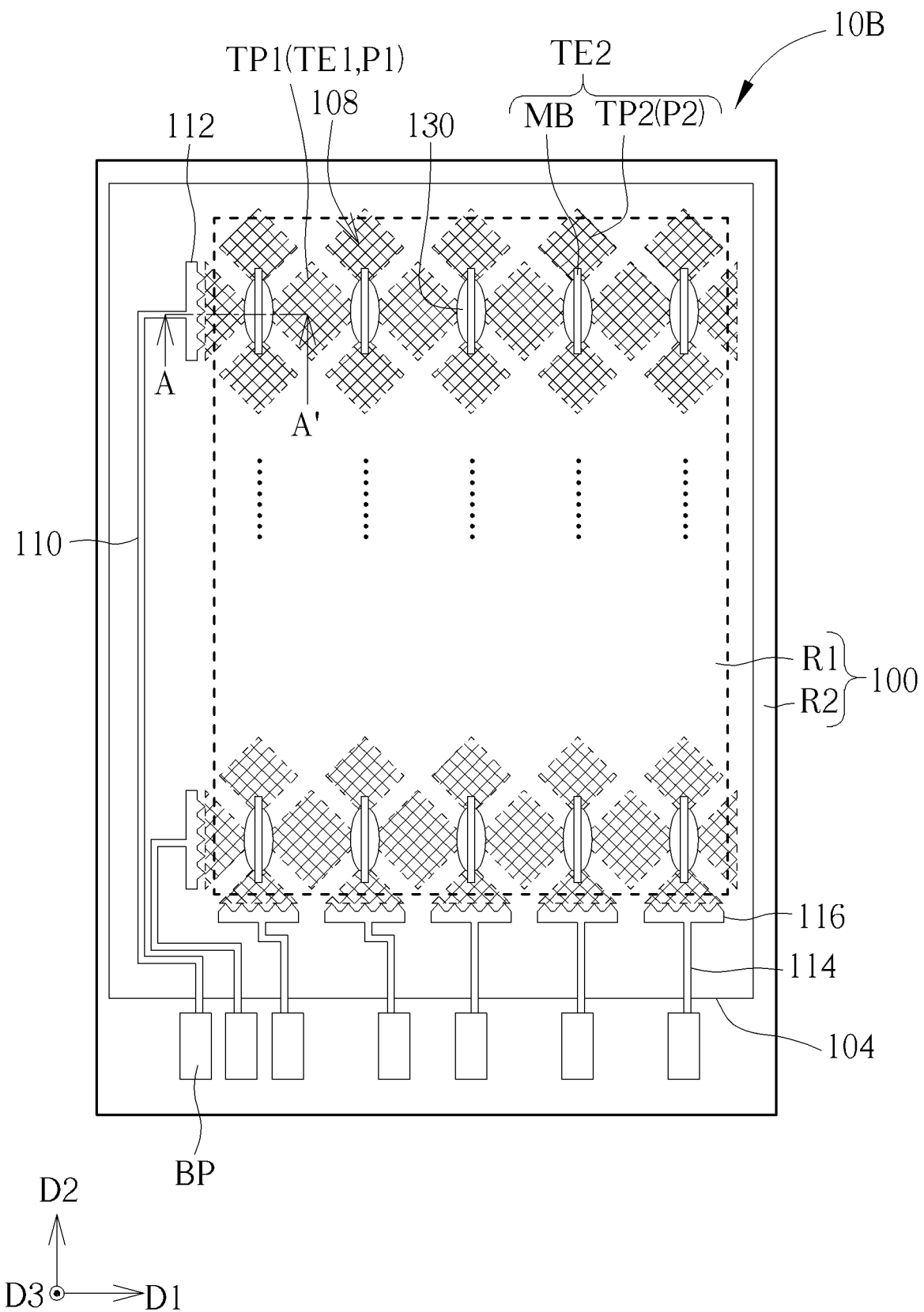
FIG. 11 is a schematic diagram of a touch display device according to an eighth embodiment of the present disclosure.
Figure 12:
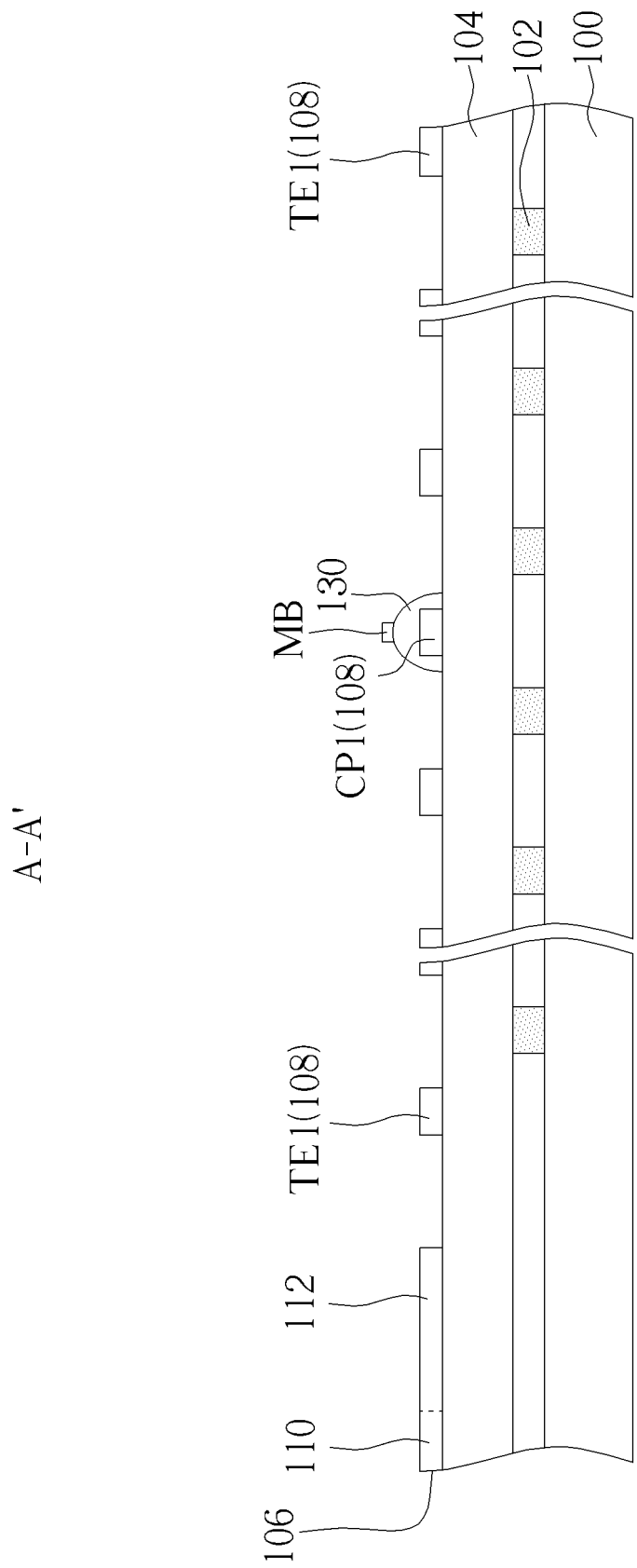
FIG. 12 is a cross-sectional diagram taken along a line A-A' in FIG. 11.

Referring to FIG. 11 and FIG. 12, FIG. 11 is a schematic diagram of a touch display device according to an eighth embodiment of the present disclosure, and FIG. 12 is a cross-sectional diagram taken along a line A-A' in FIG. 11. The main difference between the touch display device 10B of this embodiment and the first embodiment is the structures and the arrangement of the second touch electrodes TE2, while the first touch electrodes TE1 serve as the touch driving electrodes (Tx) and the second touch electrodes TE2 serve as the touch sensing electrodes (Rx) of the touch display device 10B, but not limited thereto. In this embodiment, each of the second touch electrodes TE2 includes a plurality of second touch pads TP2 and a plurality of bridges MB. The second touch pads TP2 of one second touch electrode TE2 are sequentially arranged along the second direction D2, and the bridges MB are disposed between two adjacent second touch pads TP2 respectively, so as to electrically connect the second touch pads TP2 and form the second touch electrode TE2. In this embodiment, the first touch pads TP1 and the first connection lines CP1 are formed with a first portion of the mesh units 108 included by the touch layer 106, and the second touch pads TP2 are formed with a second portion P2 of the mesh units 108 included by the touch layer 106. However, the bridges MB are formed with a patterned metal layer disposed above the touch layer 106, but not limited thereto. In addition, the touch display device 10B further includes a plurality of insulating patterns 130, each of which is disposed between one of the first connection lines CP1 and one of the bridges MB, so as to electrically isolate the first connection lines CP1 and the bridges MB.

Since the second touch electrodes TE2 extend along the second direction D2, the corresponding second anti-static electricity connecting parts 116 and the second connecting wires 114 of the touch layer 106 of the touch display device 10B are disposed in the lower part of the peripheral region R2 shown in FIG. 11. Similar to the previous embodiments, each of the first anti-static electricity connecting parts 112 is disposed between one of the first touch electrodes TE1 and one of the first connecting wires 110 to electrically connect the first connecting wire 110 and the first touch electrode TE1, and each of the second anti-static electricity connecting parts 116 is disposed between one of the second touch electrodes TE2 and one of the second connecting wires 114 to electrically connect the second connecting wire 114 and the second touch electrode TE2. Moreover, the first anti-static electricity connecting parts 112 and the second anti-static electricity connecting parts 116 respectively have a main portion and one or more sub portions, as described in preceding embodiments, and therefore those features are not redundantly described herein.

Figure 13:
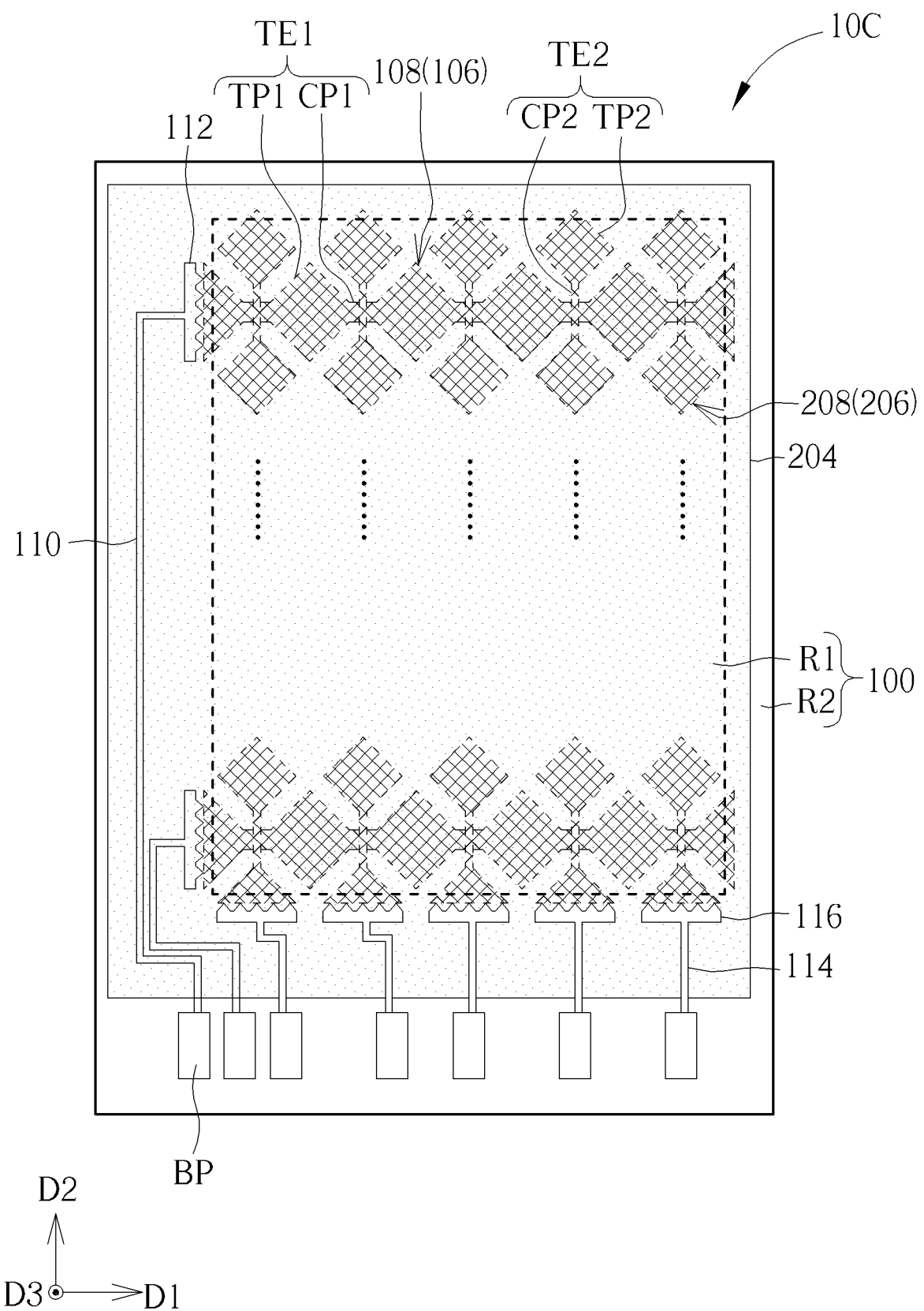
FIG. 13 is a schematic diagram of a touch display device according to a ninth embodiment of the present disclosure.

Referring to FIG. 13, FIG. 13 is a schematic diagram of a touch display device according to a ninth embodiment of the present disclosure. As shown in FIG. 13, the main difference between this embodiment and the eighth embodiment is that the touch display device 10C further includes another touch layer 206, and the first touch electrodes TE1 and the second touch electrodes TE2 are formed with different touch layers, which are the touch layer 106 and the touch layer 206 respectively. In this embodiment, the touch layer 206 is disposed on the touch layer 106, and an insulating layer 204 is disposed between the touch layer 106 and the touch layer 206 to electrically isolate the devices of the touch layer 106 and the touch layer 206. Similar to the eighth embodiment, the touch layer 106 includes the mesh units 108 forming the first touch electrodes TE1, the first connecting wires 110, and the first anti-static electricity connecting parts 112. In another aspect, in this embodiment, the touch layer 206 includes the mesh units 208 forming the second touch electrodes TE2, the second connecting wires 114, and the second anti-static electricity connecting parts 1166. Comparing to the second touch electrodes TE2 of the eighth embodiment, the second touch electrodes TE2 of this embodiment include second connection lines CP2 formed with the mesh units 208 of the touch layer 206 instead of the bridges. Therefore, the insulating patterns are no longer required in this embodiment.

Figure 14:
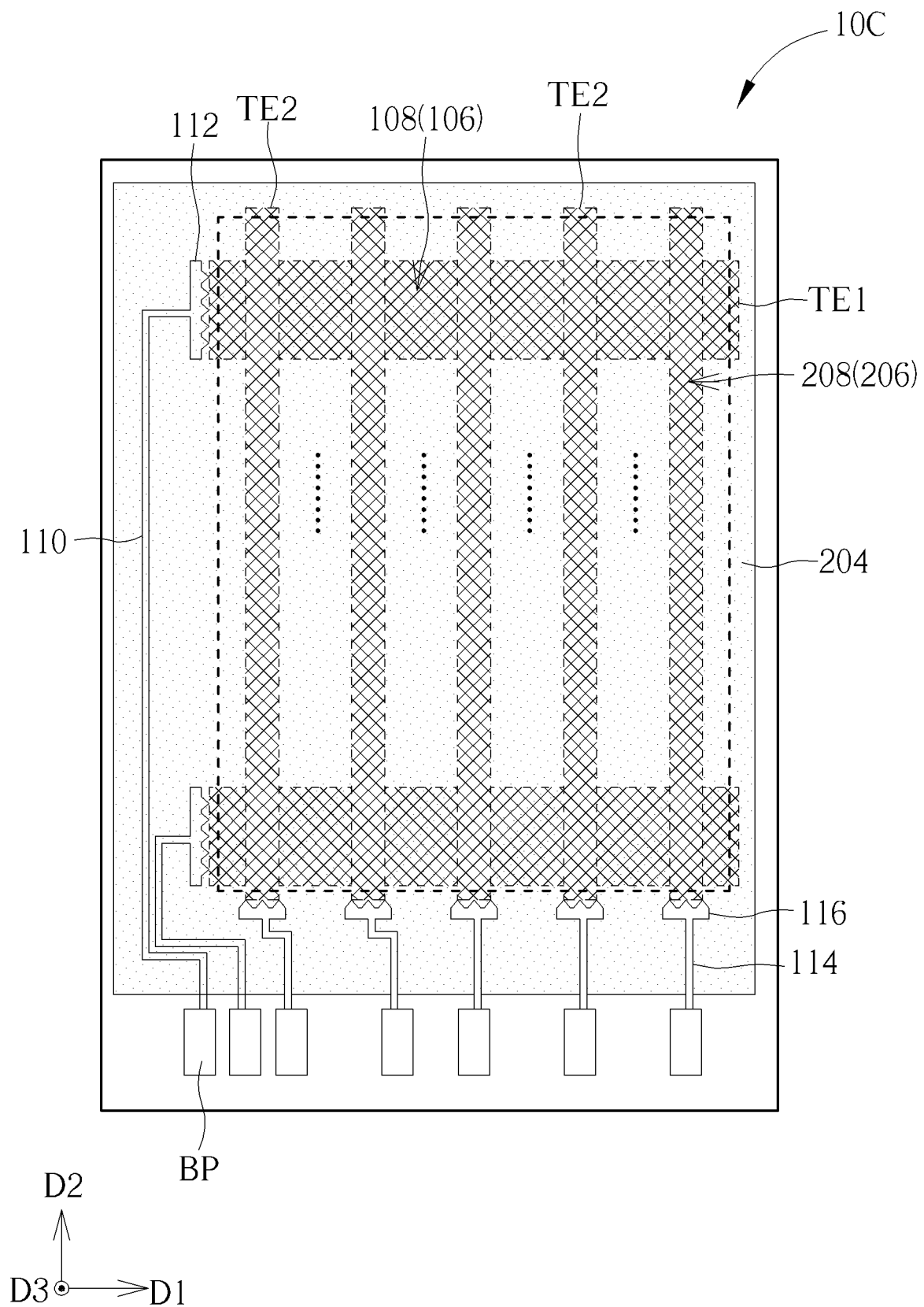
FIG. 14 is a schematic diagram of a touch display device according to a tenth embodiment of the present disclosure.
Figure 15:
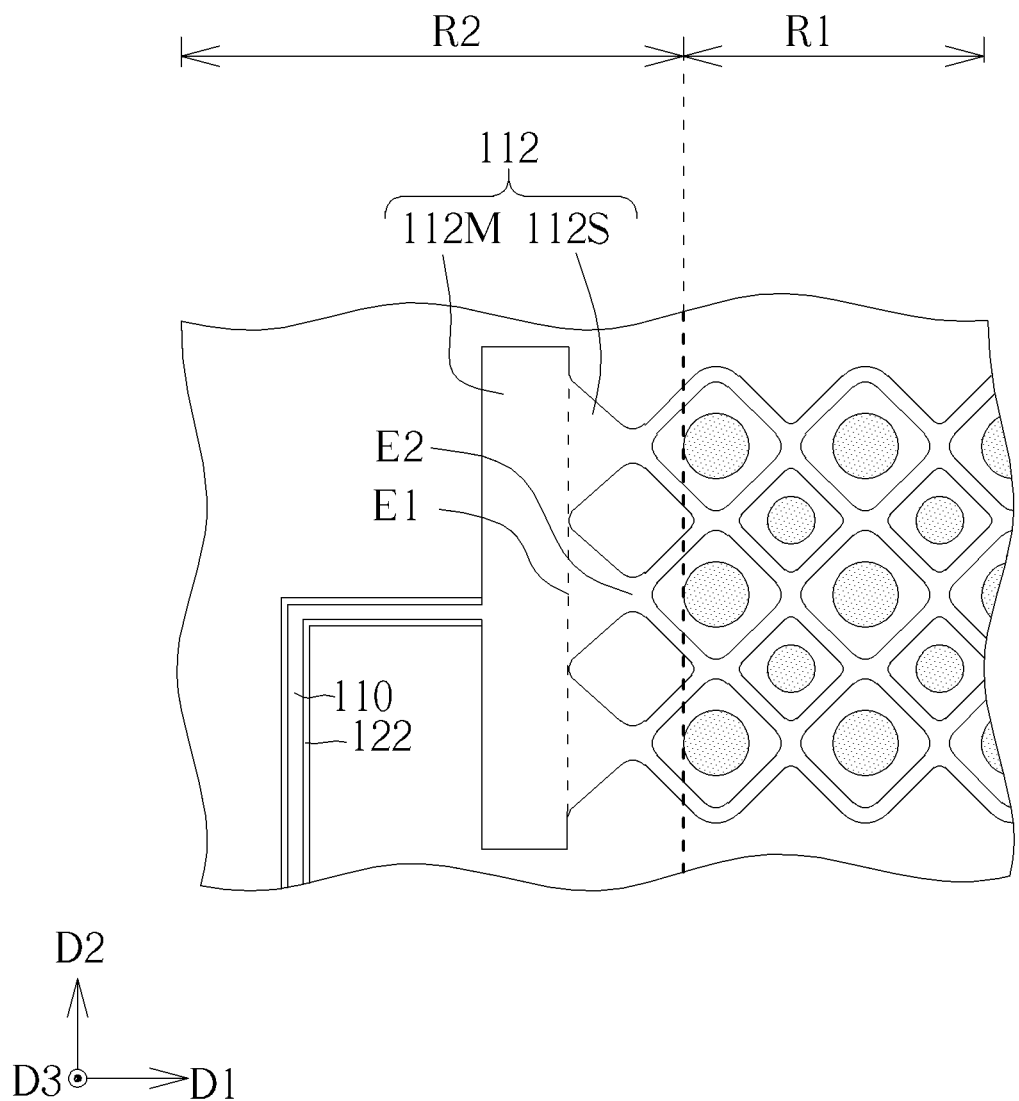
FIG. 15 is a schematic diagram of partial enlargement of a portion of a touch display device according to the tenth embodiment of the present disclosure.

Referring to FIG. 14 and FIG. 15, FIG. 14 is a schematic diagram of a touch display device according to a tenth embodiment of the present disclosure, and FIG. 15 is a schematic diagram of partial enlargement of a portion of the touch display device shown in FIG. 14. The main difference between this embodiment and the ninth embodiment is that the first touch electrodes TE1 and the second touch electrodes TE2 of the touch display device 10C are stripe electrodes, which are formed with the mesh units 108 in the touch layer 106 and the mesh units 208 in the touch layer 206 respectively. Specifically, the first touch electrodes TE1 extend along the first direction D1, and the second touch electrodes TE2 extend along the second direction D2. The second touch electrodes TE2 cross and partially overlap the first touch electrodes TE1 in the third direction D3. In this embodiment, the first touch electrodes TE1 serve as the touch driving electrodes (Tx), and the second touch electrode TE2 serve as the touch sensing electrodes (Rx), but not limited thereto.

To summarize the above descriptions, in the touch display device of the present disclosure, the mesh units are electrically connected to the connecting wires through the anti-static electricity connecting parts. More specifically, the mesh units are connected to the sub portions of the anti-static electricity connecting part, wherein the width of the sub portion may be gradually reduced from the first edge to the second edge, or from the intermediate section to the second edge, so as to prevent the static electricity damage when the relatively large current is transmitted between the main portions and the mesh units. In another aspect, the light emitting units are disposed in the corresponding mesh openings of the mesh units in the direction perpendicular to the surface of the substrate, so as to prevent the light emitted from the light emitting units from being blocked by the mesh units. Accordingly, the light emitting intensity of the touch display device is enhanced, and the display quality of the touch display device may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A touch display device, comprising:
    a substrate having a display region;
    a plurality of light emitting units disposed in the display region, wherein the plurality of light emitting units are formed on the substrate;
    an insulating layer disposed on the plurality of light emitting units; and
    a touch layer disposed on the insulating layer, the touch layer comprising:
        a plurality of mesh units disposed corresponding to the plurality of light emitting units, wherein each of the plurality of mesh units has a mesh opening, and the plurality of light emitting units are disposed in the plurality of mesh openings,
    wherein the plurality of mesh units comprise a first mesh unit and a second mesh unit, the plurality of light emitting units comprise a first light emitting unit and a second light emitting unit, the first light emitting unit emits a light with a color different from a color of a light emitted by the second light emitting unit, the first light emitting unit is disposed in the first mesh unit, and the second light emitting unit is disposed in the second mesh unit,
    wherein an area of the first mesh unit is greater than an area of the second mesh unit, and an area of the first light emitting unit is greater than an area of the second light emitting unit.

2. The touch display device of claim 1, wherein the first light emitting unit emits a red light, and the second light emitting unit emits a green light or a blue light.

3. The touch display device of claim 1, wherein the first light emitting unit emits a blue light, and the second light emitting unit emits a green light.

4. The touch display device of claim 1, further comprising a first shielding pattern disposed between the substrate and the touch layer, wherein the touch layer further comprises a first connecting wire electrically connected to a first portion of the plurality of mesh units, a portion of the first connecting wire is overlapped with the first shielding pattern in a direction perpendicular to a surface of the substrate, and the first connecting wire is electrically isolated from the first shielding pattern.

5. The touch display device of claim 4, wherein a maximum width of the first connecting wire in a direction is defined as width W7, a maximum width of the first shielding pattern in the direction is defined as width W8, and the width W7 is different from the width W8.

6. The touch display device of claim 5, wherein the width W7 and the width W8 conform a relation: $W7 \leq W8 \leq 2*W7$.

7. The touch display device of claim 1, wherein the touch layer further comprises:
    a first connecting wire electrically connected to a first portion of the plurality of mesh units; and
    a first connecting part disposed between the first connecting wire and the first mesh unit, wherein the first connecting part comprises:
        a first main portion; and
        a first sub portion, the first main portion is disposed between the first connecting wire and the first sub portion, the first sub portion is disposed between the first main portion and the first portion of the plurality of mesh units, and the first sub portion is extended toward the display region along a first direction,
    wherein the first sub portion has a first edge adjacent to the first main portion and a second edge adjacent to the display region, a second direction is perpendicular to the first direction, the first edge has a first width in the second direction, the second edge has a second width in the second direction, and the first width is greater than the second width.

8. The touch display device of claim 7, wherein widths of the first sub portion between the first edge and the second edge in the second direction are gradually reduced from the first width to the second width.

9. The touch display device of claim 7, wherein the first sub portion has an intermediate section, the intermediate section is between the first edge and the second edge, and a maximum width of the intermediate section in the second direction is greater than the first width.

10. The touch display device of claim 7, wherein the first sub portion has a trapezoid shape, a spade shape or a bullet shape.

11. The touch display device of claim 1, wherein the touch layer further comprises:
    a first connecting part disposed out of the display region and connected to a first portion of the plurality of mesh units in a first direction; and a second connecting part disposed out of the display region and connected to a second portion of the plurality of mesh units in the first direction, wherein a maximum width of the first connecting part in a second direction is different from a maximum width of the second connecting part in the second direction, and the second direction is perpendicular to the first direction.

12. The touch display device of claim 11, wherein a third portion of the plurality of mesh units forms a dummy mesh pattern, the dummy mesh pattern is disposed between the first portion of the plurality of mesh units and the second portion of the plurality of mesh units.

13. The touch display device of claim 12, wherein the dummy mesh pattern is floated.

14. The touch display device of claim 1, wherein the touch layer further comprises a first connecting part disposed out of the display region and electrically connected to a first portion of the plurality of mesh units, wherein the first connecting part comprises:
- a first main portion; and
- a first sub portion and a second sub portion, the first sub portion and the second sub portion are connected to the first main portion and disposed between the first main portion and the first portion of the plurality of mesh units, and the first sub portion and the second sub portion are extended toward the display region along a first direction, wherein the first sub portion has a first maximum width in a second direction, the second sub portion has a second maximum width in the second direction, the first maximum width is different from the second maximum, and the second direction is perpendicular to the first direction.

15. The touch display device of claim 1, wherein one of the plurality of mesh units is corresponding to only one of the plurality of light emitting units.

16. The touch display device of claim 1, wherein one of the plurality of mesh units is corresponding to at least two of the plurality of light emitting units.

17. The touch display device of claim 1, further comprising a first touch electrode composed of a portion of the plurality mesh units.

18. The touch display device of claim 17, further comprising another touch layer including a second touch electrode, wherein the second touch electrode is electrically isolated from the first touch electrode.

19. The touch display device of claim 18, wherein the second touch electrode includes a plurality of third mesh units.

20. The touch display device of claim 17, wherein the first touch electrode comprises a plurality of first touch pads and a plurality of first connection lines, and each of the first connection lines is disposed between two of the first touch pads to electrically connect the plurality of first touch pads.

* * * * *